(12) United States Patent
Ding et al.

(10) Patent No.: US 9,574,961 B2
(45) Date of Patent: Feb. 21, 2017

(54) HUMIDITY RESISTANT SENSORS AND METHODS OF MAKING SAME

(71) Applicant: Continental Automotive Systems, Inc., Auburn Hills, MI (US)

(72) Inventors: Xiaoyi Ding, Lake Zurich, IL (US); James Nowicki, Chicago, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 35 days.

(21) Appl. No.: 14/639,169

(22) Filed: Mar. 5, 2015

(65) Prior Publication Data

US 2015/0292973 A1 Oct. 15, 2015

Related U.S. Application Data

(60) Provisional application No. 61/977,421, filed on Apr. 9, 2014.

(51) Int. Cl.
*G01L 19/06* (2006.01)
*G01L 9/00* (2006.01)
*B81C 1/00* (2006.01)

(52) U.S. Cl.
CPC ....... *G01L 19/0654* (2013.01); *B81C 1/00793* (2013.01); *G01L 9/0054* (2013.01); *B81B 2201/0264* (2013.01)

(58) Field of Classification Search
None
See application file for complete search history.

(56) References Cited

U.S. PATENT DOCUMENTS

| 5,670,722 | A | * | 9/1997 | Moser | G01L 19/0084 |
| | | | | | 73/718 |
| 8,581,354 | B2 | * | 11/2013 | Fujimori | B81B 7/0058 |
| | | | | | 257/415 |
| 9,116,057 | B2 | * | 8/2015 | Brown | G01L 19/145 |
| 2004/0187588 | A1 | * | 9/2004 | Miyazawa | G01L 15/00 |
| | | | | | 73/716 |
| 2006/0214202 | A1 | * | 9/2006 | Zorich | G01L 9/0055 |
| | | | | | 257/294 |

FOREIGN PATENT DOCUMENTS

| JP | 355128131 | * | 10/1980 |
| JP | 411051795 | * | 2/1999 |

* cited by examiner

*Primary Examiner* — Robert R Raevis

(57) ABSTRACT

A pressure sensor device which uses appropriate passivation materials/patterns to make the device more robust and resistant to a hot and humid environment. The pressure sensor device uses moisture resistant passivation material(s) covering exposed glass areas, including sidewalls, and bonding interfaces to avoid the glass and bonding interfaces absorbing and reacting with moisture, thus maintaining the integrity of the device output after exposure in a humid/hot environment. These passivation materials/patterns used for the MEMS devices described may be applied to any MEMS based sensors and actuators using glass as one type of material for fabrication. The pressure sensor devices may be front side absolute pressure sensors, differential pressure sensors, or back side absolute pressure sensors.

5 Claims, 3 Drawing Sheets

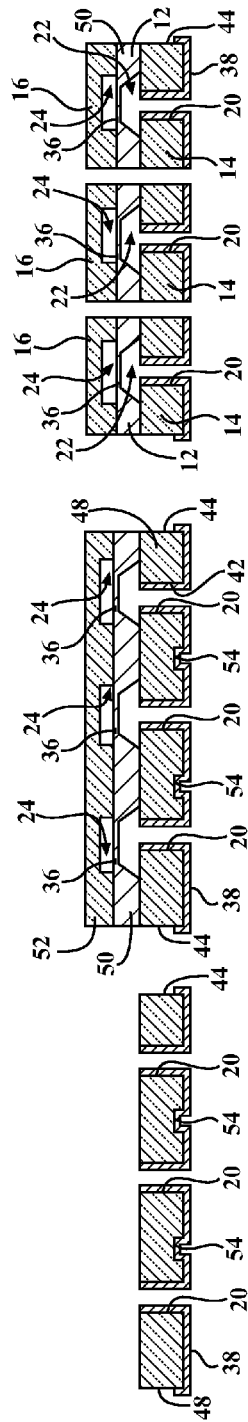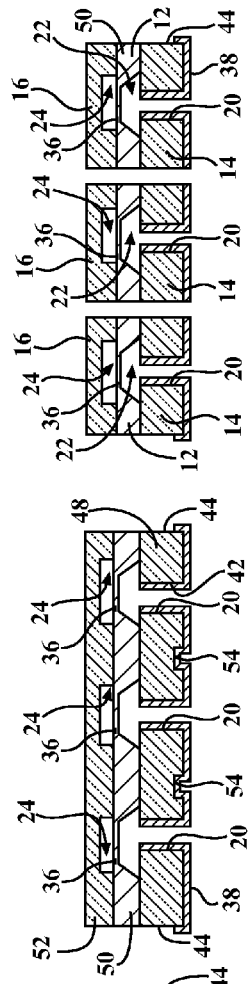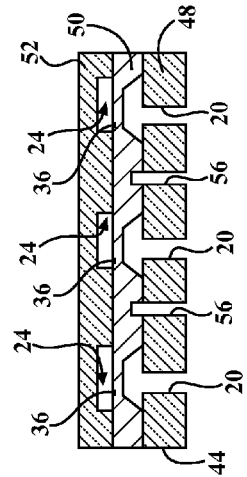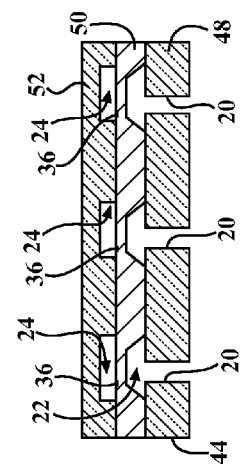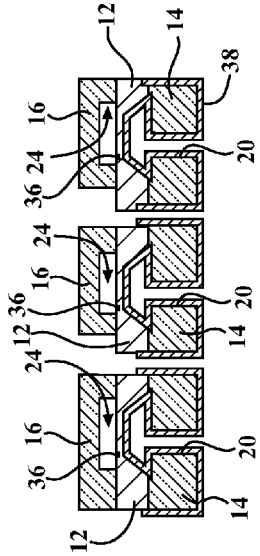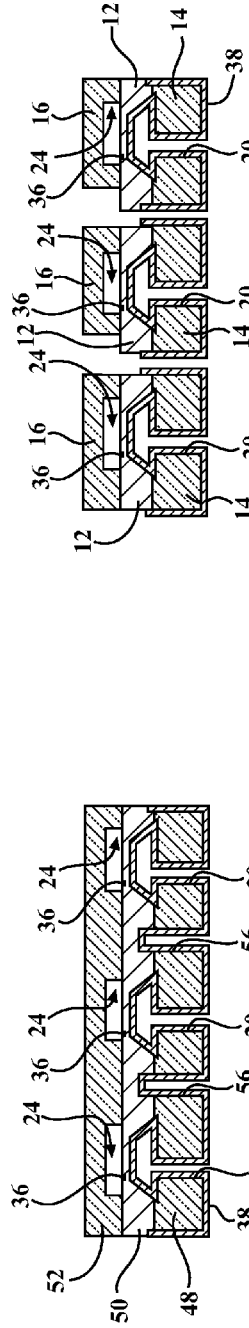

HUMIDITY RESISTANT SENSORS AND METHODS OF MAKING SAME

CROSS-REFERENCE TO RELATED APPLICATIONS

This application claims the benefit of U.S. Provisional Application No. 61/977,421 filed Apr. 9, 2014. The disclosure of the above application is incorporated herein by reference.

FIELD OF THE INVENTION

The invention relates generally to a sensor device which includes at least one passivation material which is resistant to moisture exposure in an environment having high levels of temperature and humidity.

BACKGROUND OF THE INVENTION

Due to the process maturity and low fabrication cost, the anodic bonding of borosilicate glass with silicon (Si) is widely used in constructing current microelectricalmechanical systems (MEMS) based sensors and actuators. Various types of pressure sensors which use this technology include differential pressure sensors, front side absolute pressure sensors, and backside absolute pressure sensors.

The surface layers of borosilicate glass, however, react with moisture at an elevated temperature, such as in the environment of 85% relative humidity and 85° C. temperature, which is one of the typical test conditions in the automotive industry. It is this reaction that results in device instability, causing output shift. In some cases, this output shift is not recoverable, and becomes a permanent output change, which presents a severe reliability issue.

The primary cause in this instability is due to the reaction of the glass surface with moisture, forming highly stressed surface layers that may result in a glass surface-plastic deformation. There are two major reaction areas in typical MEMS devices that may cause a significant output instability issue, they are the die attach surface and the Si-glass interface. The bottom surface of the glass pedestal for all three types of pressure sensors (differential, front side absolute, and backside absolute) is normally attached to a housing substrate by using a die attachment material. The reaction of glass with the moisture in the die attachment material may degrade the bonding force with, or may even cause delamination from, the die attachment material after long exposure in a hot and humid environment. The Si-glass bonding interface is normally exposed to the moisture around the edges of the device, where the exposed glass may also react with moisture, causing a change in the bonding force with the Si. All of these changes may cause device output shift with high thermal hysteresis, and become a permanent change in many cases.

Accordingly, there exists a need for an MEMS device which reduces or prevents device output shift when exposed to high humidity under elevated temperatures.

SUMMARY OF THE INVENTION

The present invention is a sensor device which includes at least one passivation material which is resistant to moisture exposure in an environment having high levels of temperature and humidity.

In one embodiment, the present invention is an MEMS sensor which uses appropriate passivation materials/patterns to generate new sensor structures, which are resistant to humidity under a wide temperature range. The sensor structures use moisture resistant passivation material(s) covering exposed glass area and bonding interfaces to avoid the glass and bonding interfaces absorbing and reacting with moisture, thus maintaining the integrity of the device output after exposure in a humid/hot environment. These passivation materials/patterns used for the MEMS devices described may be applied to any MEMS based sensors and actuators using glass as one of the construction materials. In one embodiment, the pressure sensors are differential pressure sensors. In another embodiment, the pressure sensors are front side absolute pressure sensors, and in yet another embodiment, the pressure sensors are back side absolute pressure sensors.

The bottom surface of the glass pedestal of the sensor is attached to a housing by a die attachment material. The Si-glass pedestal bonding interfaces are normally exposed, and sometimes may even be covered with gel. There may be fractional portions of the external side walls of the glass pedestal covered with die attach material. The various embodiments of the pressure sensors according to the present invention work in a similar manner to resist output shift when exposed to hot/humid environments.

In some embodiments, the water resistant passivation material not only covers the pedestal glass bottom surface facing the die attachment material, but also covers at least part of the side walls of the pedestal glass, or the entire pedestal side walls including the Si-glass pedestal bonding interfaces, and the backside of the Si-cavity. The structures having the passivation material which covers the exposed glass area and Si-glass bonding interfaces provides more complete protection for the device from any humidity exposure.

In one embodiment, the invention is a front side absolute pressure sensor device having a pressure sensing element, a cavity formed as part of the pressure sensing element, the cavity having a plurality of inner surfaces, and a pedestal. The pressure sensing element is bonded to the pedestal at a bonding interface. A passivation film is disposed on at least part of the pedestal, and the passivation film limits the pedestal and pressure sensing element from exposure to moisture. The pressure sensor includes at least one outer sidewall formed as part of the pedestal, and the passivation film is deposited on at least part of the outer sidewall of the pedestal. In an embodiment, the passivation film is deposited on at least a portion of the pressure sensing element such that the bonding interface around the side wall is covered by the passivation material.

In another embodiment, the pressure sensor device is a differential pressure sensor including the elements mentioned above, as well as a first aperture having an inside surface and formed as part of the pedestal, where the first aperture is in fluid communication with the cavity formed as part of the pressure sensing element. The pressure sensor device also includes a bottom surface formed as part of the pedestal, and at least a portion of the moisture resistant passivation film is disposed on the bottom surface, part of the inside surface formed as part of the aperture, and part of the sidewalls of the pedestal or entire sidewalls of the pedestal including the Si-glass bonding interface.

In yet another embodiment, the pressure sensor is a backside absolute pressure sensor having the elements mentioned above, and also includes a cap covering a portion of the Si top surface to seal a reference vacuum cavity. The mentioned backside absolute pressure sensor is formed by a sandwich structure made of cap (either Si or glass), Si and glass pedestal. An moisture resistant passivation film is disposed on the bottom surface of the glass pedestal, part of the inside surface formed as part of the aperture, and part of sidewalls of the pedestal or entire sidewalls of the pedestal, including the Si-glass bonding interface.

The passivation film may be selected from a number of different materials, such as silicon nitride, amorphous silicon, or combinations thereof, and is not limited to plasma-enhanced chemical vapor technique.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 4A to 4C are sectional side views of a backside absolute pressure sensor during the fabrication process where a moisture passivation material is deposited on the glass pedestal before forming the wafer bonding stacks, according to embodiments of the present invention;

FIG. 5A to 5D are sectional side views of back side absolute pressure sensors during the fabrication process where a moisture passivation material is deposited on the glass pedestal after forming and singulating the wafer bonding stacks, according to embodiments of the present invention;

DETAILED DESCRIPTION OF THE PREFERRED EMBODIMENTS

The following description of the preferred embodiment(s) is merely exemplary in nature and is in no way intended to limit the invention, its application, or uses.

Figure 1A:
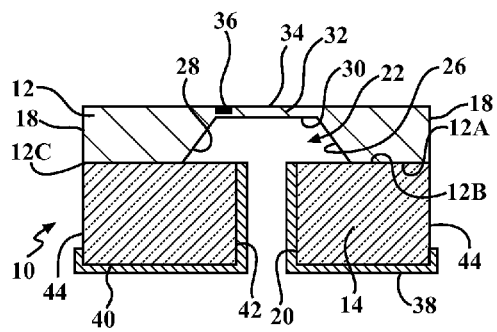
FIG. 1A is a sectional side view of a differential pressure sensor having at least one passivation material applied prior to bonding a glass pedestal wafer with a device silicon wafer, according to embodiments of the present invention.
Figure 1B:
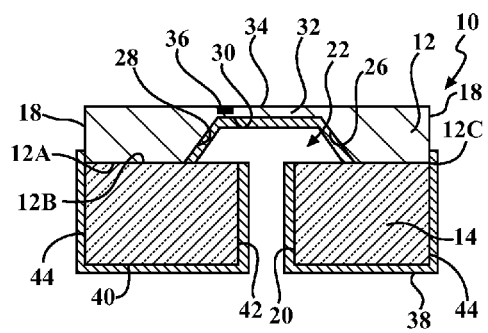
FIG. 1B is a sectional side view of a differential pressure sensor having at least one passivation material applied after singulating completed wafer bonding stacks made of bonding a glass pedestal wafer with a device silicon wafer, according to embodiments of the present invention.

A first embodiment of an MEMS pressure sensor is shown in FIGS. 1A and 1B generally at 10. In this embodiment, the pressure sensor 10 is a differential pressure sensor 10, which includes a silicon structure in the form of a pressure sensing element 12, and pedestal glass structure in the form of a glass pedestal 14. Formed as part of the glass pedestal 14 is an aperture 20, and the aperture 20 is in fluid communication with a cavity, shown generally at 22. The pressure sensing element 12 includes a bottom surface 12A which is anodically bonded to a top surface 12B of the glass pedestal 14, forming a bonding interface 12C. The pressure sensing element 12 also includes sidewalls 18.

The cavity 22 is etched into the bottom surface 12A of the pressure sensing element 12, and includes four inner surfaces, where only a first inner surface 26 and a second inner surface 28 are depicted in FIGS. 1A and 1B, because FIGS. 1A and 1B are cross-sectional views. Each of the four inner surfaces terminates into a backside surface 30, which is part of a diaphragm 32. In one embodiment, the cavity 22 is formed using an anisotropic chemical etching by potassium hydroxide (KOH), tetramethylammonium hydroxide (TMAH), etc, or a dry etch by deep reactive ion etch (DRIE), but it is within the scope of the invention that other processes may be used.

The pressure sensing element 12 is made from a single crystalline silicon, and includes the diaphragm 32, the cavity 22 having surfaces 26,28,30, and a top surface 34. The top surface of the cavity 22 is also the backside surface 30 of the diaphragm 32. The pressure sensing element 12 also includes bridge circuitry 36 on the top surface 34 of the diaphragm 32. In one embodiment, the bridge circuitry 36 contains at least four separate piezoresistors connected by P+ doped and/or metal interconnects. The piezoresistors may be placed in one of several configurations. The piezoresistors may be located close to one side of the edge of the diaphragm 32, close to four sides of the edge of the diaphragm 32, or distributed in one direction across the diaphragm 32. For drawing simplicity, FIGS. 1A and 1B do not include these details, such as interconnects, or the location of each piezoresistor. Instead, reference numeral 36 in FIGS. 1A and 1B is used to represent a generic bridge circuitry, which may be in any configuration and location as generally known in the field.

The pressure sensor 10 in the embodiment shown in FIGS. 1A and 1B also includes a passivation film 38, which is moisture resistant. In the embodiment shown in FIG. 1A, the film 38 is located on the bottom surface 40 of the pedestal 14, part of the outer sidewalls 44 of the pedestal 14, and the inside surfaces 42 of the first aperture 20. In the embodiment shown in FIG. 1B, the film 38 is applied to the bottom surface 40 of the pedestal 14, the inside surfaces 42 of the first aperture 20, and is also on the surfaces 26,28,30 of the cavity 22, the outer sidewalls 44 of the pedestal 14, and part of the sidewalls 18 of the sensing element 12 near the bonding interface 12C.

The diaphragm 32 is relatively thin, and the thickness of the diaphragm 32 depends upon the diaphragm size and the pressure sensing range. The diaphragm 32 deflects in response to pressure applied to the backside surface 30 through the aperture 20 of the substrate 14 and the cavity 22, as shown in FIGS. 1A and 1B. The deflections of the diaphragm 32 resulting from the applied pressure causes an imbalance in the bridge circuitry 36 such that the output of the bridge circuitry 36 correlates to the pressure signal.

Figure 2A:
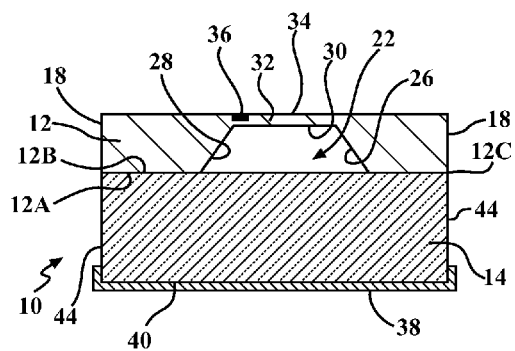
FIG. 2A is a sectional side view of a front side absolute pressure sensor having at least one passivation material applied prior to bonding a glass pedestal wafer with a device silicon wafer, according to embodiments of the present invention.
Figure 2B:
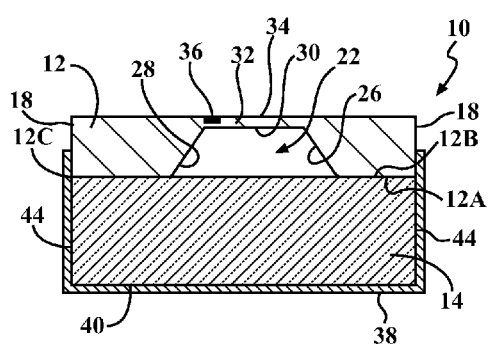
FIG. 2B is a sectional side view of a front side absolute pressure sensor having at least one passivation material applied after singulating completed wafer bonding stacks made of bonding a glass pedestal wafer with a device silicon wafer, according to embodiments of the present invention.

The embodiments of the pressure sensors shown in FIGS. 2A and 2B are front side absolute pressure sensors 10, and have similar components to the embodiments described in FIGS. 1A and 1B, with like numbers referring to like elements. These sensors 10 do not have the first aperture 20, but the sensing element 12 is still bonded to the pedestal 14. In the embodiments shown in FIG. 2A and FIG. 2B, the passivation film 38 is applied to the entire bottom surface 40 of the pedestal 14. In addition, the passivation film 38 is applied to part of the outer sidewalls 44 of the pedestal 14 in the embodiment shown in FIG. 2A, the entire outer sidewall 44 of the pedestal 14 including the bonding interface 12, and part of the sidewall 18 of the pressure sensing element 12 in the embodiment shown in FIG. 2B.

Figure 3A:
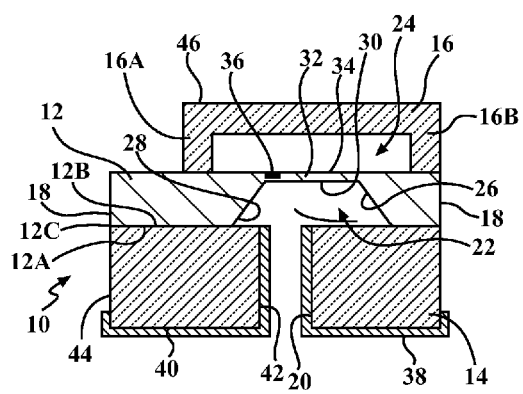
FIG. 3A is a sectional side view of a back side absolute pressure sensor having at least one passivation material applied prior to the wafer stack bonding, according to embodiments of the present invention.
Figure 3B:
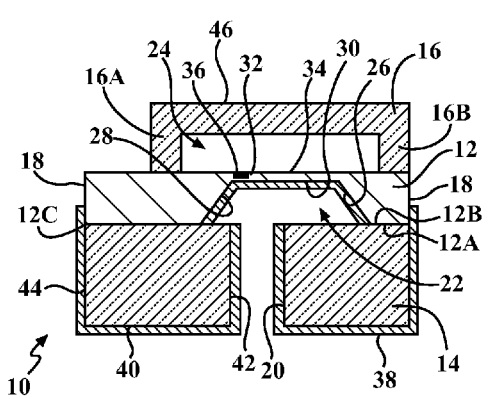
FIG. 3B is a sectional side view of a back side absolute pressure sensor having at least one passivation material applied after singulating completed wafer bonding stacks, according to embodiments of the present invention.

Referring now to FIGS. 3A and 3B, the pressure sensor 10 is a backside absolute pressure sensor 10, and has similar components to the embodiments described in FIGS. 1A and 1B, with like numbers referring to like elements. The sensor 10 shown in FIGS. 3A and 3B includes a cap substrate, in the form of a cap 16. In one embodiment, the cap 16 includes sidewalls 16A,16B, and a second cavity, shown generally at 24. The cap substrate 16 may be either Si or glass. The bonding between the cap substrate 16 and the sensing element 12 may either be anodic or frit glass sealing, which must be hermetic and in such a way that the second cavity 24 is located over the diaphragm 32, and has at least a partial vacuum.

In some embodiments, the cap 16 may be made of silicon or glass, such as borosilicate glass. In this embodiment, the cap 16 is made of borosilicate glass and is anodically bonded on top of the pressure sensing element 12 to enclose a vacuum or at least partial vacuum in the second cavity 24. This allows the pressure sensor 10 shown in FIGS. 3A and 3B to measure absolute pressure. The length and width of the second cavity 24 are close to or bigger than the length and width of the diaphragm 32.

The sensor 10 shown in FIGS. 3A and 3B also includes the moisture resistant passivation film 38. In the embodiment shown in FIG. 3A, the film 38 is located on the bottom surface 40 of the pedestal 14, the inside surfaces 42 of the first aperture 20, and part of the outer sidewalls 44 of the pedestal 14. In FIG. 3B, the film 38, is applied to the bottom surface 40 of the pedestal 14, the inside surfaces 42 of the first aperture 20, the surfaces 26,28,30 of the cavity 22, the outer sidewalls 44 of the pedestal 14, and part of the sidewall 18 of the pressure sensing element 12, such that the bonding interface 12C is also covered.

The processes used to fabricate the various sensors 10 described in FIGS. 1A-3B varies depending upon when the passivation film 38 is applied. When applied during different stages of fabrication, the film 38 is located on different surfaces, to protect different areas of the sensor 10 from the effects of humidity. For simplicity, the process steps in making the bridge circuitry 36 on the pressure sensing element 12 and the micromachining process steps on all the wafers are not included in the descriptions of the methods of making the sensors in all embodiments.

The manufacturing processes used for fabricating the sensors 10 shown in FIG. 1A and FIG. 3A is shown in FIGS. 4A-4C. Referring to FIGS. 4A-4C, there are several wafers used to create each sensing element 12 and pedestal 14 (and each cap 16 in the case of the embodiment shown in FIG. 3A). There are two wafers made of borosilicate glass, and a wafer made of silicon. A first wafer 48 made of borosilicate glass is used to create each pedestal 14, a second wafer 50 is used to create each sensing element 12, and is made of silicon, and in the case of the embodiment shown in FIG. 3A, a third wafer 52, also made of borosilicate glass, is used to make each cap 16.

With specific reference to FIG. 4A, to fabricate the pedestal 14 for each sensor 10, the apertures 20 are formed into the first wafer 48, and several trenches 54 are formed into one side of the wafer 48. Once the apertures 20 and trenches 54 are created, a hydrofluoric acid (HF) based chemical etching/polishing process is applied to the wafer 48 to remove or reduce mechanical defects existing on the outer sidewalls 44 of the trench 54 of the pedestal 14, and the inside surfaces 42 of each aperture 20. The next step is also shown in FIG. 4A, where the passivation film 38 is applied such that the film 38 is located on the bottom surface 40 of the first wafer 48, the inside surfaces 42 of the first aperture 20, and inside the trenches 54 of the first blank 48. Referring to FIG. 4B, the next step is to form the wafer bonding stack by anodically bonding the second wafer 50 to the first wafer 48, and in the case of the embodiment in FIG. 3A, to the third wafer 52 as well. Once all the bonding processes are completed, a wafer saw or the like is used to separate the wafer bonding stack made of wafers 48,50,52 in the areas of the trenches 54 to create each individual sensor 10 as shown in FIG. 4C.

In the case of the embodiment shown in FIG. 3A, the second cavity 24 of each corresponding cap 16 is etched into the third wafer 52, prior to the third wafer 52 being bonded to the second wafer 50, which is also shown in FIGS. 4B and 4C.

Referring to FIGS. 5A-5D, the process used to create the sensors 10 shown in FIG. 1B, and in the embodiment where a cap 16 is used (as shown FIG. 3B), the additional process of including the third wafer 52 used to make each cap 16 is included as well. To create the pressure sensor 10 shown in FIG. 1B, the following steps are taken, with the exception that the third wafer 52 is not used. Referring to FIG. 5A, the wafer bonding stack is formed by anodically bonding the Si wafer 50 having the sensing element 12 to the glass wafers 48,52.

In the case of the embodiment shown in FIG. 1B, the third wafer 52 is not used, and only the silicon wafer 50 is bonded to the first glass wafer 48. Next, a first cutting step, using a device such as a wafer saw, is performed to cut through specific areas of the first wafer 48 used for each pedestal 14 and partially into the silicon wafer 50, forming deep trenches 56, to expose the outer sidewalls 44 of each pedestal 14, as shown in FIG. 5B.

In FIG. 5C, the passivation film 38 is then deposited onto the first wafer 48 and second wafer 50 such that the film 38 is on the bottom surface 40 of the pedestal 14, the inside surfaces 42 of the first aperture 20, and is also on the surfaces 26,28,30 of the cavity 22. The passivation film 38 is also deposited on the outer sidewalls 44 of the pedestal 14, part of the sidewall 18, and the deep trenches 56 such that the bonding interface 12C is also covered.

After the passivation film 38 is deposited, the remaining part of the wafer 50 used for each sensing element 12 and the third wafer 52 used for each cap 16 is cut in the top area of the deep trenches 56, to form each sensor 10, shown in FIG. 5D.

Figure 6A:
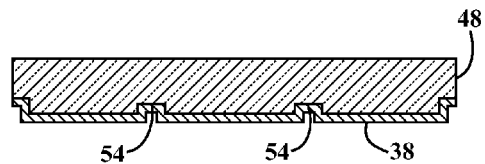
FIG. 6A to 6C are sectional side views of front side absolute pressure sensors during the fabrication process, where a moisture resistant material is deposited on the glass pedestal before forming the wafer bonding stacks, according to embodiments of the present invention.
Figure 6B:
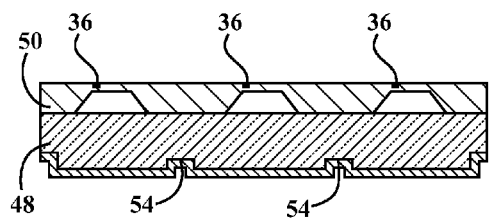
Figure 6C:
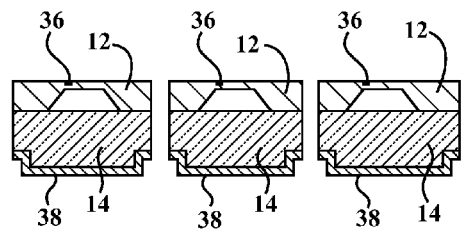

Referring to FIGS. 6A-6C, the fabrication process for creating the pressure sensor shown in FIG. 2A is shown. This embodiment has the first wafer 48 made of borosilicate glass, which is used to make each pedestal 14. In FIG. 6A, several trenches 54 are formed into the first wafer 48, and the HF based chemical etching/polishing process is then applied to polish the bottom surfaces 40 and the trenches 54 of the pedestal 14. The last step shown in FIG. 6A is to deposit the passivation film 38 such that the film 38 is on the bottom surface 40, and in the trenches 54 of the pedestal 14. In FIG. 6B, the wafer 50 having each sensing element 12 and each cavity 22 is anodically bonded to the first wafer 48 having the trenches 54 of the pedestal 14, forming the wafer bonding stack. The next step is shown in FIG. 6C, where the wafer saw process is applied to the wafer bonding stack in the top area of the trenches 54 to separate the wafer bonding stack into each sensor 10.

Figure 7A:
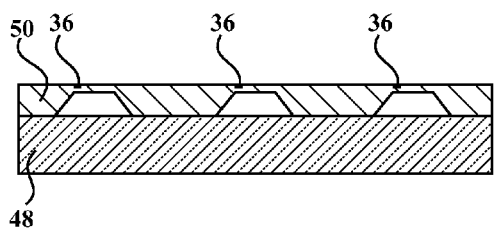
FIG. 7A to 7D are sectional side views of a wafer made of borosilicate glass bonded to a wafer made of silicon, used to make several front side absolute pressure sensors, according to embodiments of the present invention.
Figure 7B:
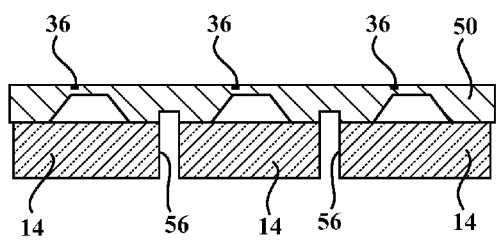
Figure 7C:
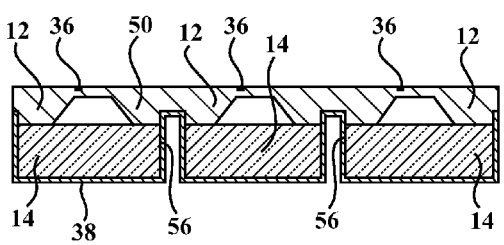
Figure 7D:
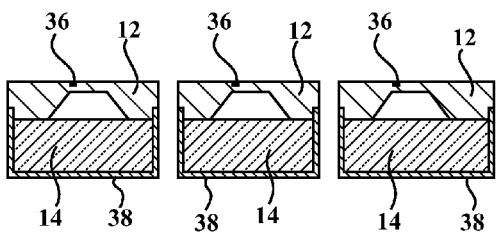

Referring now to FIGS. 7A-7D, the fabrication process for creating the pressure sensor shown in FIG. 2B is shown. In FIG. 7A, there is a wafer 48 of borosilicate glass and a wafer 50 of silicon containing the pressure sensing elements 12 that are anodically bonded together forming the wafer bonding stack. In FIG. 7B, a first cutting step is performed to cut through the first wafer 48 used for each pedestal 14, and partially into the silicon wafer 50, forming a plurality of deep trenches 56, to expose the outer sidewalls 44 of each pedestal 14, and part of the pressure sensing element 12 in the area of the bonding interface 12C. The next step is shown in FIG. 7C, where the passivation film 38 is then deposited onto the first wafer 48 such that the film 38 is on the bottom surface 40 of each pedestal 14, and the deep trenches 56, covering the outer sidewalls 44 of each pedestal 14 and part of the sidewall 18 of each pressure sensing element 12, such that each bonding interface 12C is also covered with the passivation film 38. After the passivation film 38 is applied, the remaining part of the wafer 50 used for each sensing element 12 in the wafer bonding stack is cut to complete the fabrication of each sensor 10, shown in FIG. 7D.

In further regard to the construction of each sensor 10, the passivation film 38 is used such that each type of sensor 10 is resistant to humidity. Each sensor 10 uses the moisture resistant passivation film 38 to cover exposed areas of the glass pedestal 14 and bonding interfaces 12C to prevent the bonding interfaces 12C and pedestal 14 from absorbing and reacting with moisture, thus maintaining the integrity of the output of each sensor 10 after exposure in a humid/hot environment. The application of the passivation film 38 used for the MEMS sensors 10 described may be applied to any MEMS based sensors and actuators using glass as one of the construction materials for the device fabrication. The various embodiments of the pressure sensors 10 according to the present invention resist output shift when exposed to hot/humid environments.

In further regard to the fabrication process for the sensors 10 shown in FIGS. 1A, 2A, and 3A, the passivation film 38 being applied in each trench 54 and part of the outer sidewalls 44 provides coverage of each pedestal 14 in the area of the pedestal 14 connected to the die attach material on a housing substrate. This is the area of the glass pedestal 14 which is under a high bending stress when high pressure is applied to the bottom of the pedestal 14 through the aperture 20. The film 38 is preferred to have a compressive stress to counterbalance the bending stress and increase the strength of the pedestal 14 when a high pressure is applied from the bottom of the pedestal 14 through the aperture 20. Different types of films having compressive stress could be produced and used, such as, but not limited to, nitride and amorphous silicon, or a composite film, using plasma-enhanced chemical vapor deposition (PECVD). Additionally, the HF based chemical etching process applied to each sensor 10 in FIGS. 1A, 2A, and 3A also removes or reduces the mechanical defects such as chipping or cracking of the pedestal 14, making the pedestal 14 more robust to a high bending stress.

In further regard to the fabrication process for the structures shown in FIGS. 1B, 2B, and 3B, the first cutting step shown in FIG. 5B and FIG. 7B not only cuts through the entire wafer 48 used to make each glass pedestal 14, but also cuts slightly into the second wafer 50 used to make each sensing element 12 (a fractional thickness of the Si). In one embodiment, the depth cut into the wafer 50 is about 50 μm-100 μm, but it is within the scope of the invention other depths may be used. The purpose is to cover the bonding interface 12C between each pressure sensing element 12 and the glass pedestal 14 with the passivation film(s) to avoid bonding degradation from humidity exposure.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
   a pressure sensor, including:
      a pressure sensing element having a top surface and a bottom surface, and a sensing circuit disposed on the top surface of the pressure sensing element;
      a cavity formed as part of the bottom surface of the pressure sensing element, the cavity having a plurality of inner surfaces;
      a pedestal having a top surface and a bottom surface, the bottom surface of the pressure sensing element bonded to the top surface of the pedestal; and
      at least one passivation film;
      a bonding interface, the pressure sensing element being attached to the pedestal at the bonding interface;
      at least one outer sidewall formed as part of the pedestal;
      at least sidewall formed as part of the pressure sensing element, the at least one sidewall of the pressure sensing element is substantially adjacent to the at least one outer sidewall formed as part of the pedestal;
   wherein the at least one passivation film is deposited on the bottom surface of the pedestal, and the passivation film is deposited on at least a portion of the at least one outer sidewall of the pedestal and a portion of the at least one sidewall formed as part of the pressure sensing element such that the bonding interface is covered by the at least one passivation film.

2. The apparatus of claim 1, wherein the passivation film is deposited on at least a portion of the at least one side wall formed as part of the pressure sensing element and the at least one outer sidewall formed as part of the pedestal in proximity to the bonding interface.

3. The apparatus of claim 2, further comprising:
   a first aperture formed as part of the pedestal, in fluid communication with the cavity formed as part of the pressure sensing element; and
   an inside surface being part of the first aperture;
   wherein at least a portion of the passivation film is disposed on part of the inside surface formed as part of the aperture, and the plurality of inner surfaces formed as part of the cavity.

4. The apparatus of claim 3, further comprising:
   a cap; and
   at least one recess formed as part of the cap;

wherein the cap is connected to the top surface of the pressure sensing element such that the recess covers a portion of the top surface of the pressure sensing element.

5. The apparatus of claim 1, the passivation film further comprising nitride, amorphous silicon, and combinations thereof by plasma-enhanced chemical vapor deposition.

* * * * *